United States Patent
Cleveland

(10) Patent No.: US 6,178,117 B1
(45) Date of Patent: Jan. 23, 2001

(54) BACKGROUND CORRECTION FOR CHARGE GAIN AND LOSS

(75) Inventor: Lee Cleveland, Santa Clara, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/490,352

(22) Filed: Jan. 24, 2000

(51) Int. Cl.[7] .................................................. G11C 16/04
(52) U.S. Cl. ..................................... 365/185.19; 365/200
(58) Field of Search ........................ 365/185.19, 185.24, 365/185.29, 200

(56) References Cited

U.S. PATENT DOCUMENTS

| | | | | |
|---|---|---|---|---|
| 5,532,962 | * | 7/1996 | Auclair et al. ........................ | 365/201 |
| 5,689,459 | * | 11/1997 | Change et al. ................... | 365/185.28 |
| 5,699,298 | * | 12/1997 | Shiau et al. ...................... | 365/185.18 |
| 5,717,632 | * | 2/1998 | Richart et al. ..................... | 365/185.2 |
| 5,745,410 | * | 4/1998 | Yiu et al. .......................... | 365/185.3 |

* cited by examiner

*Primary Examiner*—David Nelms
*Assistant Examiner*—Thong Le
(74) *Attorney, Agent, or Firm*—H. Donald Nelson

(57) ABSTRACT

A method of checking and repairing individual memory bits in a nonvolatile memory device having memory bits arranged in sectors. An unused sector is identified and each memory bit in the sector is checked to identify memory bits having a charge gain or a charge loss. An erase pulse is applied to each memory bit having a charge gain and a programming pulse is applied to each memory bit having a charge loss.

1 Claim, 3 Drawing Sheets

BACKGROUND CORRECTION FOR CHARGE GAIN AND LOSS

BACKGROUND OF THE INVENTION

1. Field of the Invention

This invention relates generally to the art of microelectronic integrated circuits. More specifically, this invention relates to microelectronic nonvolatile memory integrated circuits. Even more specifically, this invention relates to a method of correcting for the loss or gain of charge in memory bits in nonvolatile memory devices.

2. Discussion of the Related Art

There are several examples of nonvolatile memory integrated circuits. One such nonvolatile memory integrated circuit is a microelectronic flash or block erase Electrically Erasable Programmable Read-Only Memory (Flash EEPROM) device that includes an array of cells that can be independently programmed and read. The size of each cell and thereby the memory device are made small by omitting transistors known as select transistors that enable the cells to be erased independently. As a result, all of the cells must be erased together as a block.

A flash memory of this type includes individual Metal-Oxide-Semiconductor (MOS) field effect transistor memory cells, each of which includes a source, a drain, a floating gate and a control gate to which various voltages are applied to program the cell with a binary 1 or 0, to erase all of the cells as a block, to read the cell, to verify that the cell is erased or to verify that the cell is not overerased.

The memory cells are connected in an array of rows and columns, with the control gates of the cells in a row being connected to a respective wordline and the drains of the cells in a column being connected to a respective bitline. The sources of all the cells are connected together. This arrangement is known as a NOR memory configuration.

A cell is programmed by applying a voltage, typically 9 volts to the control gate, applying a voltage of approximately 5 volts to the drain and grounding the source causing hot electrons to be injected from a drain depletion region into the floating gate. Upon removal of the respective programming voltages, the injected electrons are trapped in the floating gate creating a negative charge therein that increases the threshold voltage of the cell to a value in excess of approximately 4 volts.

A cell is read by applying typically 5 volts to the wordline to which the control gate of the cell is connected, applying 1 volt to the bitline to which the drain of the cell is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying a relatively high voltage, typically 12 volts, to the source, grounding the control gate and allowing the drain to float erases a cell. These applied voltages cause the electrons that were injected into the floating gate during programming to undergo Fowler-Nordheim tunneling from the floating gate through the thin tunnel oxide layer to the source. In another arrangement, applying a negative voltage on the order of −10 volts to the control gate, applying 5 volts to the source and allowing the drain to float also erases a cell. A further method of erasing a cell is by applying 5 V to the P-well and −10 V to the control gate while allowing the source and drain to float.

A problem with the flash EEPROM memory devices is that due to manufacturing tolerances, some cells that have been programmed can lose charge over time to the point that they no longer will read as being programmed. Other cells that have been erased can gain charge over time to the point they no longer will read as being erased. Because there is no way to determine the point at which the individual cells will cause errors during read because of charge loss or gain, the lifetime of the memory may be unnecessarily shortened to ensure that errors during read do not occur.

Therefore, what is needed is a method to check each cell for charge loss or gain as to correct the charge gain or loss in each individual memory cell to prevent the stored data from being corrupted.

SUMMARY OF THE INVENTION

According to the present invention, the foregoing and other objects and advantages are obtained by a method of checking each memory bit for charge gain or loss and for correcting each individual memory bit that has either a charge gain or a charge loss.

In accordance with an aspect of the invention, an unused sector in a nonvolatile memory device is identified and each memory bit in the unused sector is checked to identify memory bits having a charge gain or a charge loss. An erase pulse is applied to each erased memory bit having a charge gain and a programming pulse is applied to each programmed memory bit having a charge loss.

In accordance with another aspect of the invention, a threshold voltage of each memory bit is stored in a latch. The threshold voltage stored in the latch is compared to a charge loss threshold voltage if the bit is a programmed memory bit and if the threshold voltage of the programmed memory bit is less than the charge loss threshold voltage, a programming pulse is applied to the memory bit.

In accordance with another aspect of the invention, the threshold voltage stored in the latch is compared to a charge gain threshold voltage if the bit is an erased memory bit and if the threshold voltage of the erased memory bit is greater than the charge gain threshold voltage, an erase pulse is applied to the memory bit.

The described method thus provides a method of correcting for the loss or gain of charge in nonvolatile memory bits in nonvolatile memory devices.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention. The following detailed description describes the present invention in relation to an EEPROM flash memory device. It should be understood that the present invention is applicable to any nonvolatile memory device and that a person of ordinary skill in the art using the following detailed description can apply the teachings herein, without undue experimentation, to other nonvolatile memory devices.

Figure 1A:
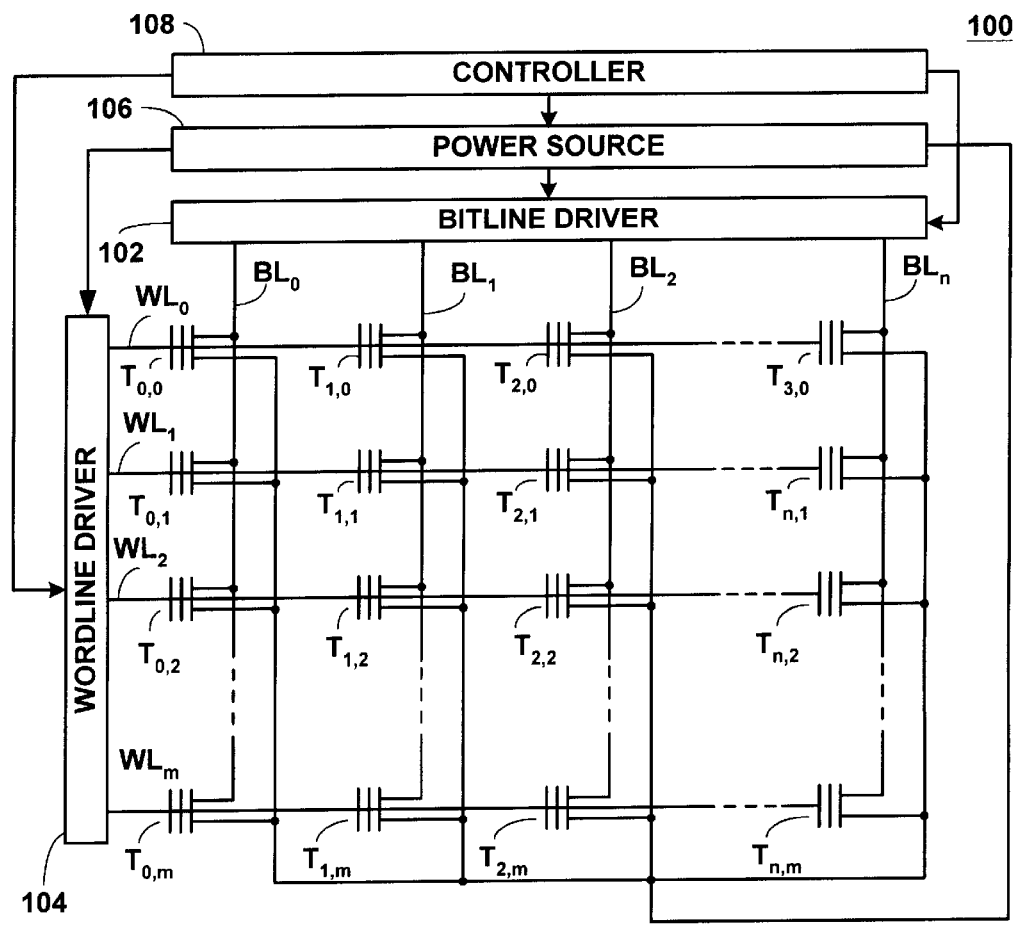
FIG. 1A is a simplified electrical schematic diagram of a flash EEPROM.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. A bitline driver 102 applies appropriate voltages to the bitlines and a wordline driver 104 applies appropriate voltages to the wordlines. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
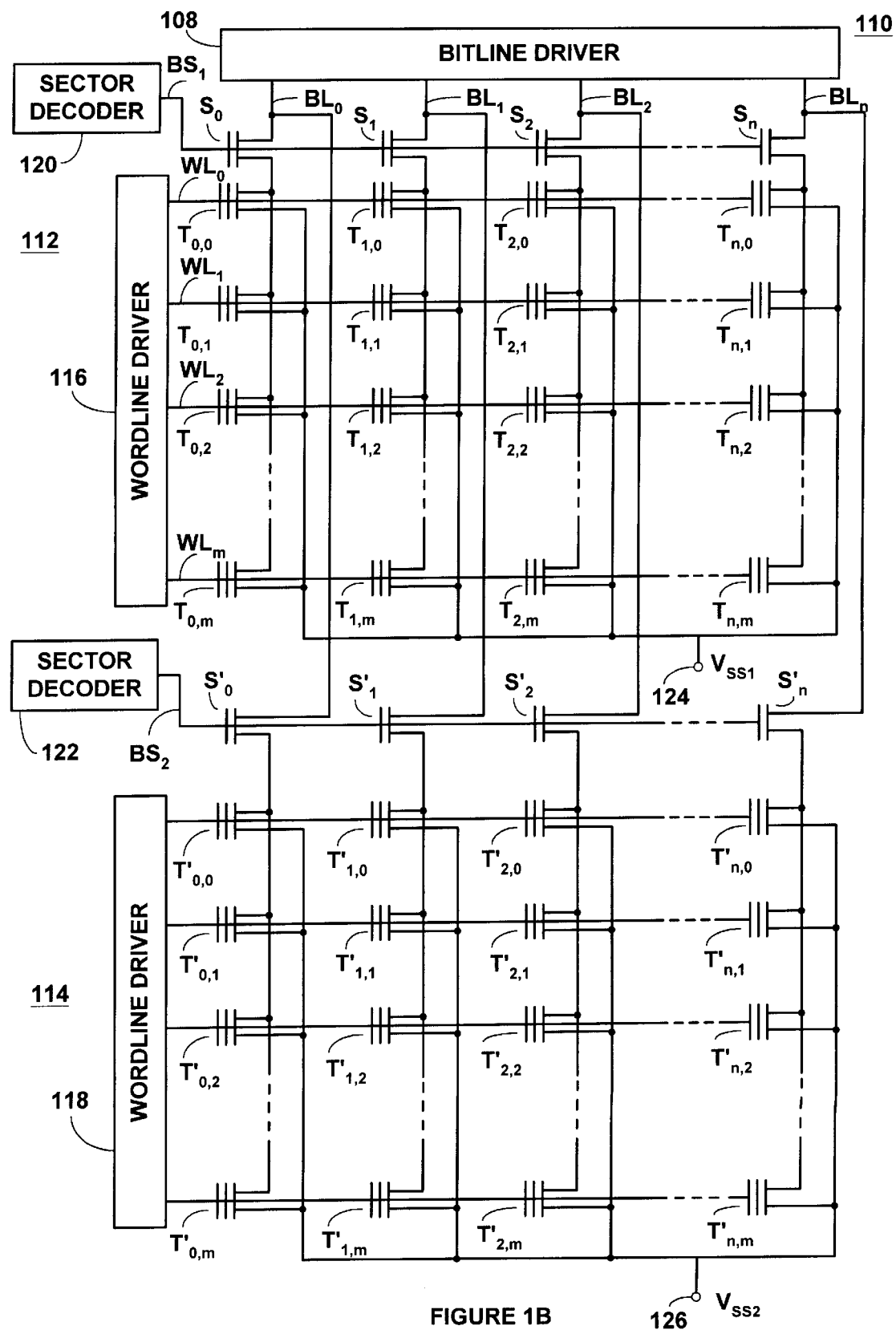
FIG. 1B is similar to FIG. 1A but illustrates a flash EEPROM having memory cells arranged in two pages or banks.

FIG. 1B illustrates another flash EEPROM memory 110 which is similar to the memory 100 except that the cells are divided into banks, (also known as pages or sectors), two of which are shown in FIG. 1B, each of which can be programmed, erased, and read independently. It should be appreciated that a typical flash memory device can have many banks, however, only two are shown here for simplicity. The memory 110 shown in FIG. 1B includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122.

The sources of the cells in bank 112 are connected to a common source supply voltage $V_{SS1}$ 124 and the sources of the cells in the bank 114 are connected to a common source supply voltage $V_{SS2}$ 126.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S'_0$ to $S'_n$ and disconnects the memory cells from the bitlines. The bank 114 is selected and deselected in an essentially similar manner using the bank select signal $BS_2$ and select transistors $S'_0$ to $S'_n$. Other banks, not shown, may also be selected and deselected in a similar manner using bank select signals $BS_X$ and select transistors similar to $S'_0$ to $S'_n$. The operation of the memory 110 is essentially similar to that of the memory 100 (FIG. 1A), except that the program, erase and read operations can be performed on the banks 112 & 114 or any other bank independently.

Figure 2:
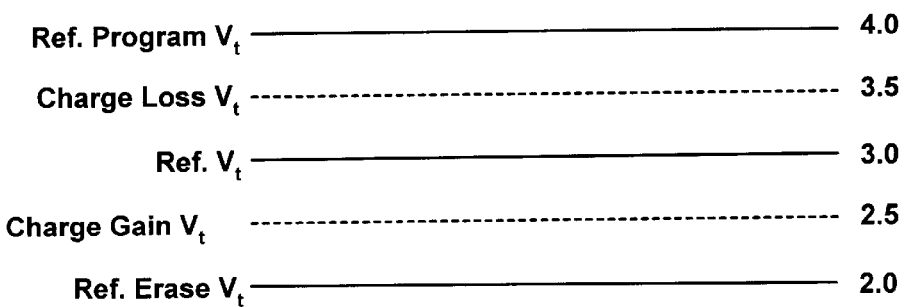
FIG. 2 is a diagram showing various threshold voltage levels in a flash memory cell.

FIG. 2 is a diagram showing various threshold voltage levels in a flash memory device such as the ones that would be used in the devices shown in FIGS. 1A and 1B. It is to be understood that the voltage values are examples only of the various voltage values and the voltage values are given for illustrative purposes only. An erased memory cell should have an erase threshold voltage $V_t$ above 2.0 volts and preferably under 2.5 volts. If the threshold voltage of the erased memory cell is above 2.5 volts and under 3.0 volts, the memory cell could still read as erased, however, it may not. The charge gain $V_t$ shown as 2.5 volts in FIG. 2 is the charge gain threshold for erased memory bits. Similarly, a programmed memory cell should have a programmed threshold voltage $V_t$ under 4.0 volts and preferably above 3.5 volts. If the threshold voltage of the programmed memory cell is under 3.5 and above 3.0 volts, the memory cell could still read as programmed, however it may not. The charge gain Vt shown as 3.5 volts in FIG. 2 is the charge loss threshold for programmed memory bits. The checking algorithm of the present invention checks to determine the threshold voltage of each programmed and erased cell and if a programmed cell has a voltage under 3.5 volts, indicating charge loss, the correction algorithm causes the memory cell to receive programming pulses to increase the threshold voltage. Similarly if the checking algorithm determines that an erased cell has a voltage above 2.5 volts, indicating charge gain, the correction algorithm causes the memory cell to receive erasure pulses.

Figure 3:
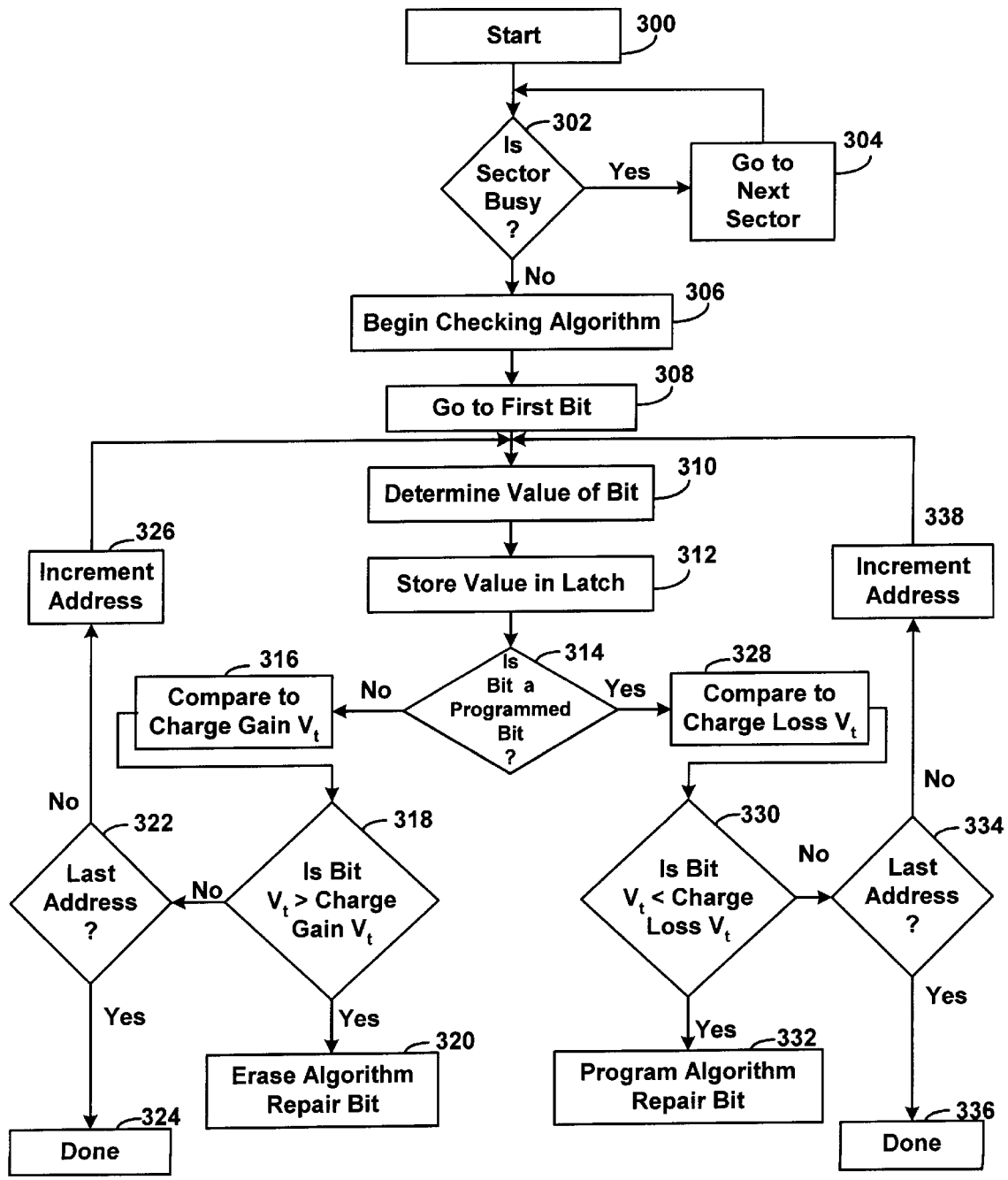
FIG. 3 is a flow diagram of a memory cell checking and correction algorithm that checks each memory cell in a flash memory device and corrects for either charge gain or charge loss.

FIG. 3 is a flow diagram of a memory cell checking and correction algorithm that checks each memory cell in a memory device such as a flash memory device. The algorithm starts at 300 and checks at 302 if a particular sector or bank is busy. If the sector or bank is busy, the flow goes to the next sector at 304 and it is again checked at 302 if the sector is busy. The steps at 302 and 304 repeat until it is determined at 302 that the sector is not busy. When a sector is determined to be not busy at 302, the checking algorithm begins at 306. The checking algorithm goes to the first bit in the bank of cells as indicated at 308 and determines the value of the bit at 310. The value of the bit is stored in a latch as indicated at 312. It is determined at 314 if the bit is a programmed bit.

If it is determined at 314 that the bit is not a programmed bit, that is, it is an erased bit, the value stored in the latch at 312 is compared to the charge gain $V_t$ (see FIG. 2) at 316. If it is determined at 318 that the threshold voltage of the bit is greater than the charge gain $V_t$, an erase algorithm at 320 is used to repair the bit by applying an erase pulse to the bit to reduce the threshold voltage of the bit If it is determined at 318 that the threshold voltage of the bit is not greater than the charge gain $V_t$, it is determined at 322 if the bit just checked is the last address in the sector of the flash memory device being checked. If the bit just checked is the last address, the checking is done as indicated at 324. If the bit just checked is not the last address, the address is incremented at 326 and the threshold voltage of the bit is determined at 310 and the steps as described above repeat until the sector of the flash memory device being checked is finished.

If it is determined at 314 that the bit is a programmed bit, the value stored in the latch at 312 is compared to the charge loss $V_t$ (see FIG. 2) at 328. If it is determined at 330 that the threshold voltage of the bit is less than the charge loss $V_t$, a programming algorithm at 332 is used to repair the bit by applying a programming pulse to the bit to increase the threshold voltage of the bit.

If it is determined at 330 that the threshold voltage of the bit is greater than the charge loss $V_t$, it is determined at 334 if the bit just checked is the last address in the sector of the flash memory device being checked. If the bit just checked is the last address, the checking is done as indicated at 336. If the bit just checked is not the last address, the address is incremented at 338 and the threshold voltage of the bit determined at 310 and the steps as described above repeat until the sector of the flash memory device being checked is finished.

In summary, the present invention overcomes the limitations of the prior art and provides a method of correcting for the loss or gain of charge in nonvolatile memory bits in nonvolatile memory devices.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of repairing individual memory bits in a nonvolatile memory device wherein the individual memory bits are arranged in sectors, the method comprising the steps of:

(a) identifying an unused sector in the nonvolatile memory device by determining a state of a sector select line;

(b) checking each memory bit in the unused sector to identify memory bits having a charge gain or a charge loss by:
  (i) determining a threshold voltage of a first memory bit;
  (ii) storing the threshold voltage in a latch; and
  (iii) determining if the memory bit is a programmed memory bit;

(c) comparing the threshold voltage stored in the latch to a charge loss threshold voltage if the memory bit is a programmed memory bit;

(d) applying a programming pulse to the memory bit if the memory bit is a programmed memory bit and if the threshold voltage of the memory bit is less than the charge loss threshold voltage;

(e) comparing the threshold voltage stored in the latch to a charge gain threshold voltage if the memory bit is not a programmed memory bit;

(f) applying an erase pulse to the memory bit if the memory bit is not a programmed memory bit and if the threshold voltage of the memory bit is greater than the charge gain threshold voltage;

(g) determining if the memory bit just checked is the last memory bit;

(h) determine a threshold voltage of a next memory bit if the memory bit checked is not the last memory bit;

(i) repeat steps (b)(ii)–(h) until it is determined that the memory bit just checked is the last memory bit; and (j) considering the checking done if the memory bit just checked is the last memory bit.

* * * * *